US005530765A

United States Patent [19]
Zampini et al.

[11] Patent Number: 5,530,765
[45] Date of Patent: Jun. 25, 1996

[54] DEPTH OF FADE INDICATING LED

[75] Inventors: Michael A. Zampini; Alan Flum, both of Boca Raton, Fla.

[73] Assignees: Sony Corporation, Japan; Sony Electronics, Inc., N.J.

[21] Appl. No.: 227,623

[22] Filed: Apr. 14, 1994

[51] Int. Cl.[6] .................... H04B 1/00; H03G 3/00

[52] U.S. Cl. .................... 381/119; 381/104; 381/109

[58] Field of Search .................... 381/119, 109, 381/118, 123, 104, 105, 107; 340/815.45

[56] References Cited

U.S. PATENT DOCUMENTS

| | | | |
|---|---|---|---|
| 5,175,771 | 12/1992 | Zampini et al. | 381/119 |
| 5,177,801 | 1/1993 | Shoda et al. | 381/109 |
| 5,210,502 | 5/1993 | Flum et al. | 330/85 |
| 5,230,024 | 7/1993 | Zampini et al. | 381/119 |
| 5,259,034 | 11/1993 | Lumsden | 381/119 |
| 5,317,641 | 5/1994 | Yasuda et al. | 381/119 |
| 5,319,359 | 6/1994 | Zampini et al. | 340/815.45 |
| 5,424,679 | 6/1995 | Rappoport | 381/109 |
| 5,434,539 | 7/1995 | Rappoport | 381/109 |

*Primary Examiner*—Forester W. Isen
*Assistant Examiner*—Xu Mei
*Attorney, Agent, or Firm*—Ronald P. Kananen

[57] ABSTRACT

Disclosed is an audio follow video mixer apparatus having a circuit which indicates the position of an adjustable depth of fade control member. When the depth of fade control member is adjusted to a position which does not permit full attenuation of an audio signal according to a FADE control signal, a depth of fade LED indicator is illuminated. According to one embodiment, the LED is driven by a Schmidt inverter directly coupled to the FADE control signal line. According to an alternative embodiment, the depth of fade control member is a dual element fader having a first element in the FADE signal path and a second element biased to drive the depth of fade LED indicator according to the position of the depth of fade control member.

10 Claims, 4 Drawing Sheets

DEPTH OF FADE INDICATING LED

FIELD OF THE INVENTION

This invention relates to an audio follow video mixer having an adjustable depth of fade control. More particularly, it relates to a depth of fade indicating LED which indicates that a depth of fade control member is in a position other than one which provides full attenuation of an audio signal.

BACKGROUND OF THE INVENTION

Audio follow video mixers are utilized in professional recording applications to process several channels of audio input to a mixer console. Such mixer systems may be operated manually or under control of signals supplied by a video editor coupled to the mixer console. In a typical operation, two audio channels are mixed by performing a cross fade between two active channels. This operation involves fading out a first audio signal, while fading in a second. More particularly, a FADE OUT operation involves attenuating an audio signal from a first amplitude to a second amplitude; conversely, a FADE IN operation involves amplifying an audio signal from a first level to a second level. This may be achieved by supplying the audio signal to be attenuated to a voltage control amplifier (VCA) device which attenuates the audio signal according to an analog control voltage supplied thereto.

Several commercially available mixer devices are equipped with control members which are adjusted to set both the maximum and minimum levels of a particular audio channel in the mixer during a FADE operation. Typically, a first potentiometer is used to control the maximum level of the audio channel and a second potentiometer is used to control the minimum level of the audio channel obtained during a FADE.

A particularly advantageous configuration for performing FADE IN and FADE OUT operations is described in commonly-owned patent application Ser. No. 07/683,887, entitled "Fader Depth Control Apparatus," the disclosure of which is hereby incorporated by reference. As shown in FIG. 1, this configuration utilizes a main fader member (for example, a linear potentiometer) to control the maximum level at which an audio signal is amplified, and a secondary fader member to determine the absolute level by which an audio signal is attenuated (that is, the minimum level of the audio signal after a FADE OUT operation).

This configuration is shown in detail in FIG. 2, wherein a VCA control voltage is applied through a switch SW which can be in a first or second position. As shown, the switch SW is in a position corresponding to a channel activation position such that VCA control voltages may be supplied through the switch to IC 5. IC 5 is a buffer for the VCA control signal. In another position, the channel is deactivated such that no control voltages may be supplied to this channel. In the circuit shown, the VCA control signal is a direct voltage signal which varies from a first level corresponding to maximum attenuation (typically +5 V) to a second level corresponding to maximum gain (typically 0 V). The VCA control signal may be supplied from a video editor to the mixer console via an editor interface (not shown).

The output of IC 5 is provided to a depth of fade control 10. This depth of fade control supplies the VCA control signal to the non-inverting input of IC 6. The depth of fade control 10 is illustrated as a variable resistance voltage divider (such as a linear potentiometer) which determines the amount of attenuation of the VCA control signal. For example, in the position indicated as "$-\infty$" the VCA control signal from the editor (not shown) is sent to the IC 6 without change. In other positions, the depth of fade control 10 lowers the level of the VCA control signals. For example, at the ground position, the resulting control signal of 0 V corresponds to full gain of the audio signal input to the VCA. At an intermediate position, located between $-\infty$ and full gain, the depth of fade control provides attenuation of the audio signal by some factor between full attenuation and maximum gain.

A voltage divider 30 functions in a known manner as a reference voltage generator, while a main fader is shown as element 20. Collectively, ICs 1, 2, 3 and 4 function as a curve shaping circuit in a known manner to shape the curve for the channel fader 20. The signal from the fader 20, after being subject to the curve shaping circuit, is supplied to IC 7. Both IC 6 and IC 7 are precision rectifiers which function similarly to an analog OR gate. These elements operate to compare the main fader signal and the editor signal. The larger of the main fader signal and the fader depth signal (by voltage) is passed on to a buffer and voltage adjuster (IC 8). The output of IC 8 is coupled to the control input of a VCA which controls the gain of an input audio channel according to the larger of either the main fader signal or the editor signal. In this way, the depth of fade level (determining the minimum level of amplification during a FADE) and the main channel fader level (determining the maximum level of amplification during a FADE) are set separately and independently.

This configuration has been incorporated into the MXP-390 series mixer produced by the assignee of this invention. While successfully providing an independent means to adjust the absolute minimum of a signal to be faded out in a FADE operation, MXP-390 series mixers suffer a drawback in that the position of the depth of fade control member (the secondary fader shown in FIG. 1) may not be readily apparent. Although symbols are printed on the MXP-390 series mixer console to indicate the position of the depth of fade member, such symbols are difficult to read, and thus fail to clearly indicate when the depth of fade member is slightly out of a full attenuation position.

For example, in a typical operation the mixer console is configured to cross fade from a first channel A to a second channel B. Thus, it is intended that an audio channel A should be gradually attenuated from a first level, usually unity gain, to maximum attenuation ($-\infty$ dB), while a second audio channel B is amplified from maximum attenuation to full gain. That is, channel A should FADE OUT and channel B should FADE IN. However, if it is unnoticed by the operator that the depth of fade control member corresponding to input audio channel A is not in a position permitting full attenuation, audio channel A will not be fully attenuated at the end of the cross fade operation. Instead, an audio signal corresponding to channel A will remain in the output path leading from the VCA. Thus, if the mixed (cross faded) output signal is recorded, for example, an unwanted audio signal which includes channel A may be present in the recorded signal. Moreover, since such an unwanted audio signal is usually substantially attenuated, it is difficult to detect during typical recording monitoring, but may be detected after distribution of the recording. Therefore, this problem may lead to unnecessary costs in re-recording.

Moreover, this problem is not merely confined to MXP-390 series mixers. Rather, other mixers which provide a separate depth of fade control member to adjust the maximum attenuation of an audio signal suffer would benefit from a clearer indication of the position of the depth of fade control member.

Accordingly, there is a need to provide an improved depth of fade control device which provides a clear indication to an operator of the position of the depth of fade control member.

SUMMARY OF THE INVENTION

It is an object of this invention to meet this need by providing an audio mixer apparatus comprising: means for generating a FADE signal provided to an audio mixer, said FADE signal determining the amount of attenuation of an audio signal in said audio mixer apparatus; first fader level control means for adjusting a maximum level of said FADE signal provided from said generating means; second fader level control means for adjusting a minimum level of said FADE signal provided from said generating means; and means, including a LED operatively coupled to said first fader level control means, for providing a visual indication of the amount maximum level of said FADE signal determined by said first fader level control means.

According to a first embodiment of the invention, a depth of fade LED indicator is coupled to the signal path of the FADE signal via a Schmidt inverter, whereby the inverter detects the maximum level of the FADE signal and illuminates the LED when the maximum level of the FADE signal is below a predetermined threshold voltage which corresponds to maximum attenuation of the audio signal.

According to a second embodiment of the invention, the first fader level control means comprises a dual element potentiometer having a first element located in the signal path of the FADE signal and a second element biased to provide a depth of fade voltage signal indicative of the position of a depth of fade control member which adjusts the dual element potentiometer, whereby a depth of fade LED is driven to an ON state depending on the level of the depth of fade voltage signal.

Both embodiments may be incorporated on a mixer apparatus in which the minimum level of the FADE signal is adjusted by the second fader level control means independently of the maximum level adjusted by the first fader level control means.

DETAILED DESCRIPTION OF THE PREFERRED EMBODIMENTS

Figure 1:
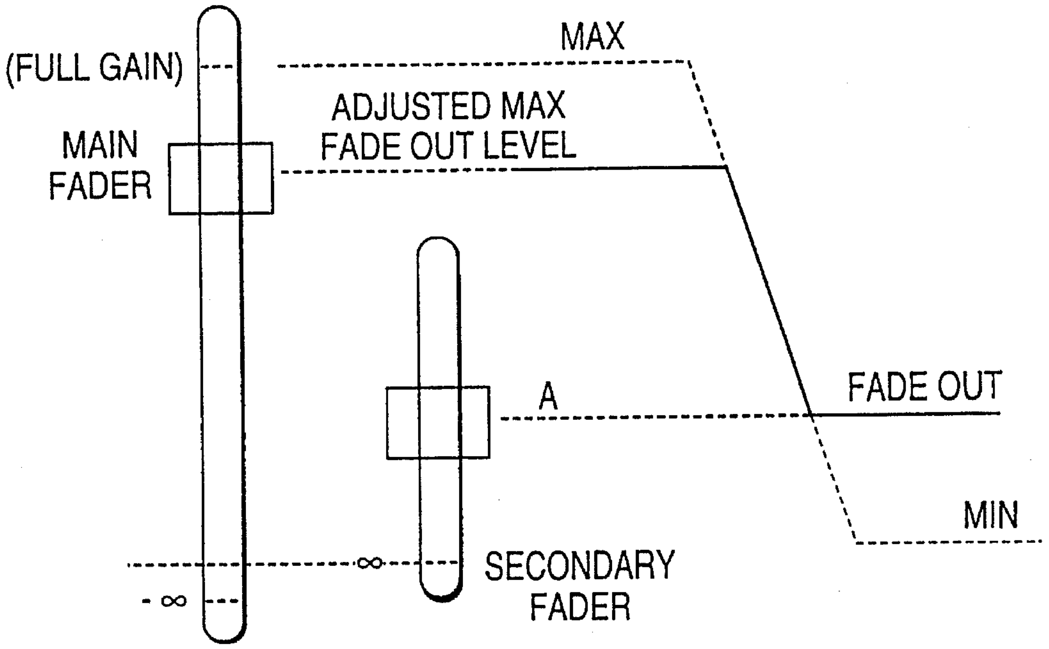
FIG. 1 PRIOR ART
FIG. 1 is an illustration of portion of a prior art mixer console having a depth of fade control for use in a fade operation.
Figure 3:
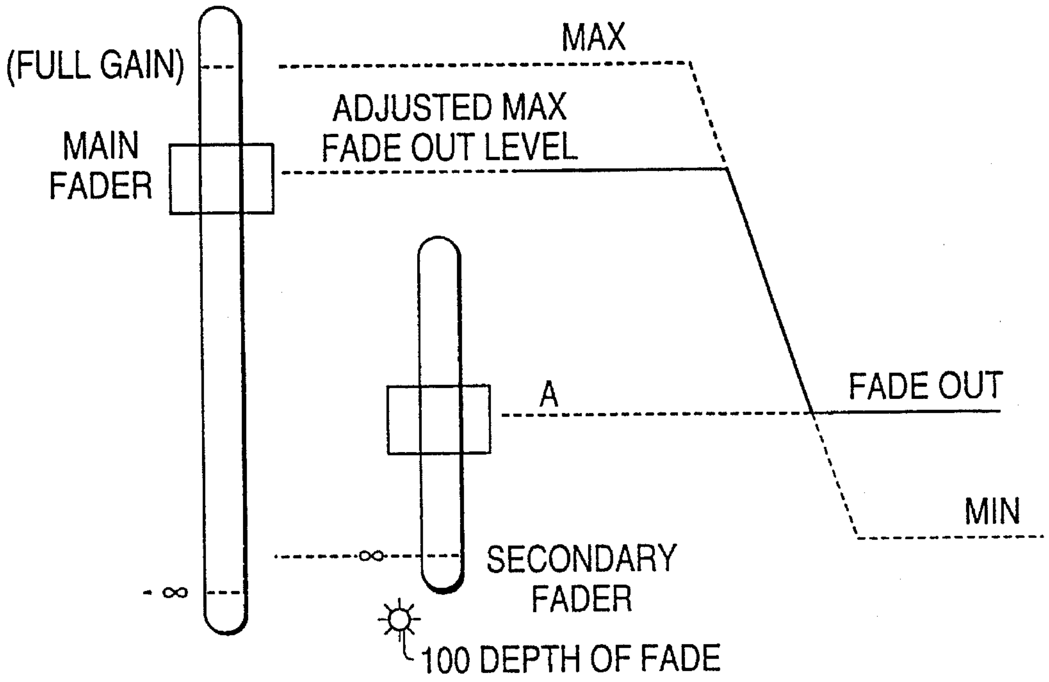
FIG. 3 is an illustration of an improved mixer console having a depth of fade control according to the prior art.

FIG. 3 shows a display portion of an audio follow video mixer console according to the invention. As shown a main fader is used to provide a FADE signal which variably controls the level at which a VCA amplifies an audio signal. A main fader member, associated with an audio mixing console, may be used to move the main fader from a first position corresponding to an absolute maximum value (full gain of the audio signal) to a lower position corresponding to an adjusted maximum level which provides greater attenuation of an input audio channel. Also shown is a secondary fader member (that is, a depth of fade control member) positioned at an arbitrary reference point A which determines the absolute minimum level of amplification of the input audio channel.

Positioned as shown, the FADE signal provided to a VCA control input will be as shown in solid lines. That is, the input to the VCA control input will be adjusted from a first voltage corresponding to full gain to a second voltage corresponding to maximum attenuation. As illustrated, the secondary fader member is set at a position above the full attenuation position ($-\infty$), therefore, the audio channel input to the VCA controlled by the main fader and secondary fader will not be fully attenuated at the completion of the FADE OUT operation, but will remain in the output of the VCA.

In order to alert an operator that the depth of fade will not result in full attenuation of the input audio signal, a depth of fade light emitting diode (LED) indicator 100 is provided in proximity to the secondary fader member on the audio mixer console. The depth of fade LED indicator 100 is operatively connected to the depth of fade control circuit such that it is lit when the depth of fade control member (the secondary fader member) is above its bottom position. This provides a visual indication to the operator that the audio channel which is controlled by the corresponding depth of fade control member will not be fully attenuated after a FADE OUT operation (or, conversely, at the beginning of a FADE IN operation).

Figure 4:
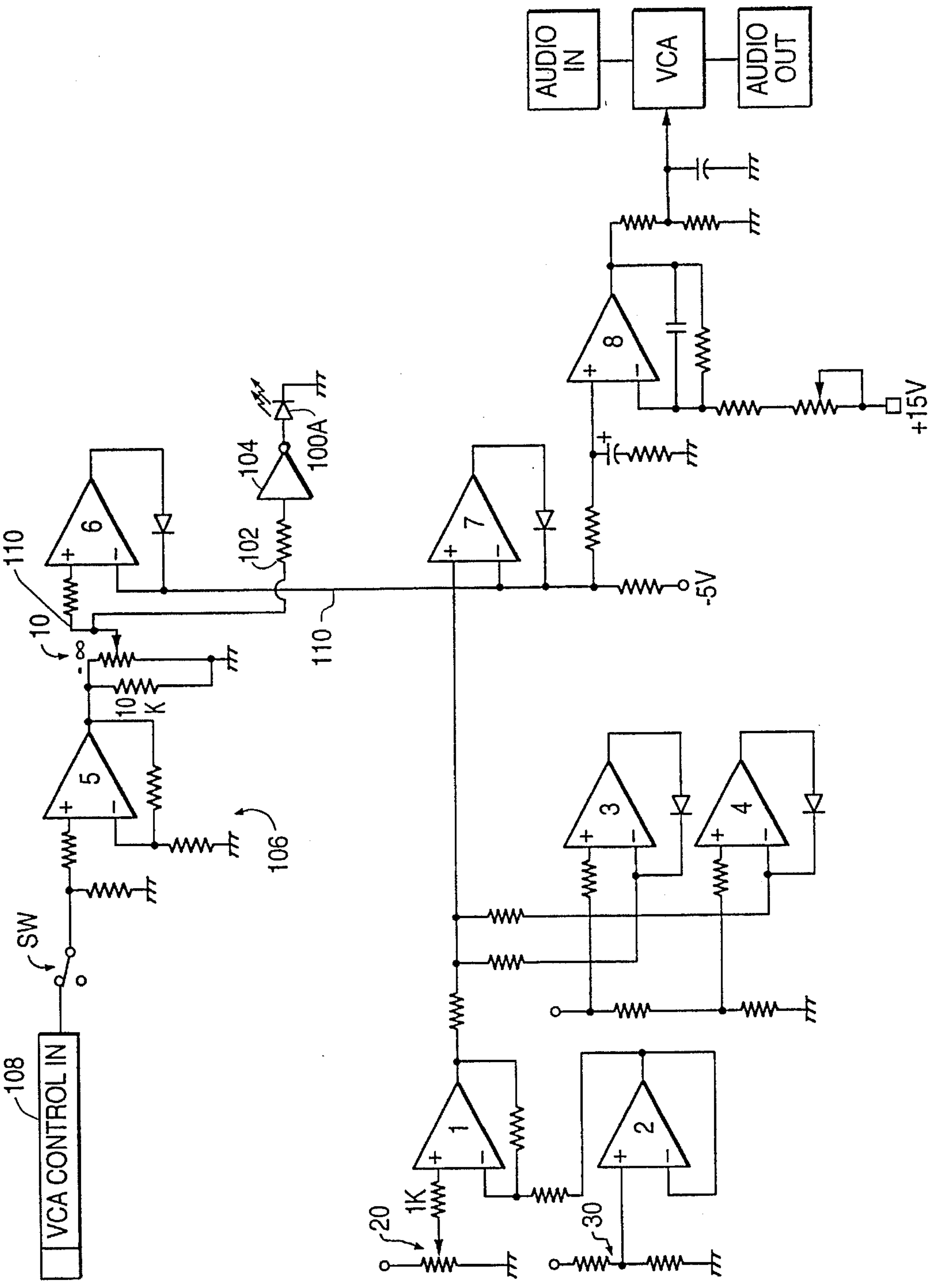
FIG. 4 is a detailed representation of an improved depth of fade indicator circuit according to a first embodiment of the invention.

A first detailed embodiment of the invention is illustrated by FIG. 4. As shown, a VCA control line 110 which transmits a dc voltage (0 to 5 V in this example), is coupled via a resistor 102 to a Schmidt inverter 104. A depth of fade LED indicator 100A is provided such that its anode is directly coupled to the output of the Schmidt inverter 104 while its cathode is coupled to ground. The resistor 102 has a sufficiently high value that the VCA control signal transmitted through control line 110 is not degraded.

The Schmidt inverter 104 is selected to have a threshold voltage which is as close as possible to the control voltage level which corresponds to maximum attenuation. In this way, the Schmidt inverter 104 will drive the depth of fade LED indicator 100A to an ON (illuminated) state whenever a control voltage is supplied to the VCA which results in some amplification of the input audio signal. Conversely, when a control voltage is supplied to the VCA which results in full attenuation of the input audio signal, the depth of fade LED indicator 100A will remain unilluminated.

For example, if as discussed above, the control voltage varies from 0 volts (corresponding to full gain) to +5 V (corresponding to maximum attenuation), the Schmidt inverter would be selected to have a threshold voltage as near to +5 V as possible. Thus, the depth of fade LED indicator 100A will be illuminated whenever a control signal which does not result in maximum attenuation (that is, a control signal less than +5 V) is provided from the depth of fade control circuit 106 to the noninverting input of IC 7.

Thus, according to this arrangement, an operator is made aware that the audio channel corresponding to the audio in channel will be provided from audio output of the VCA, despite a FADE OUT signal being provided to the VCA control input terminal 108.

Figure 2:
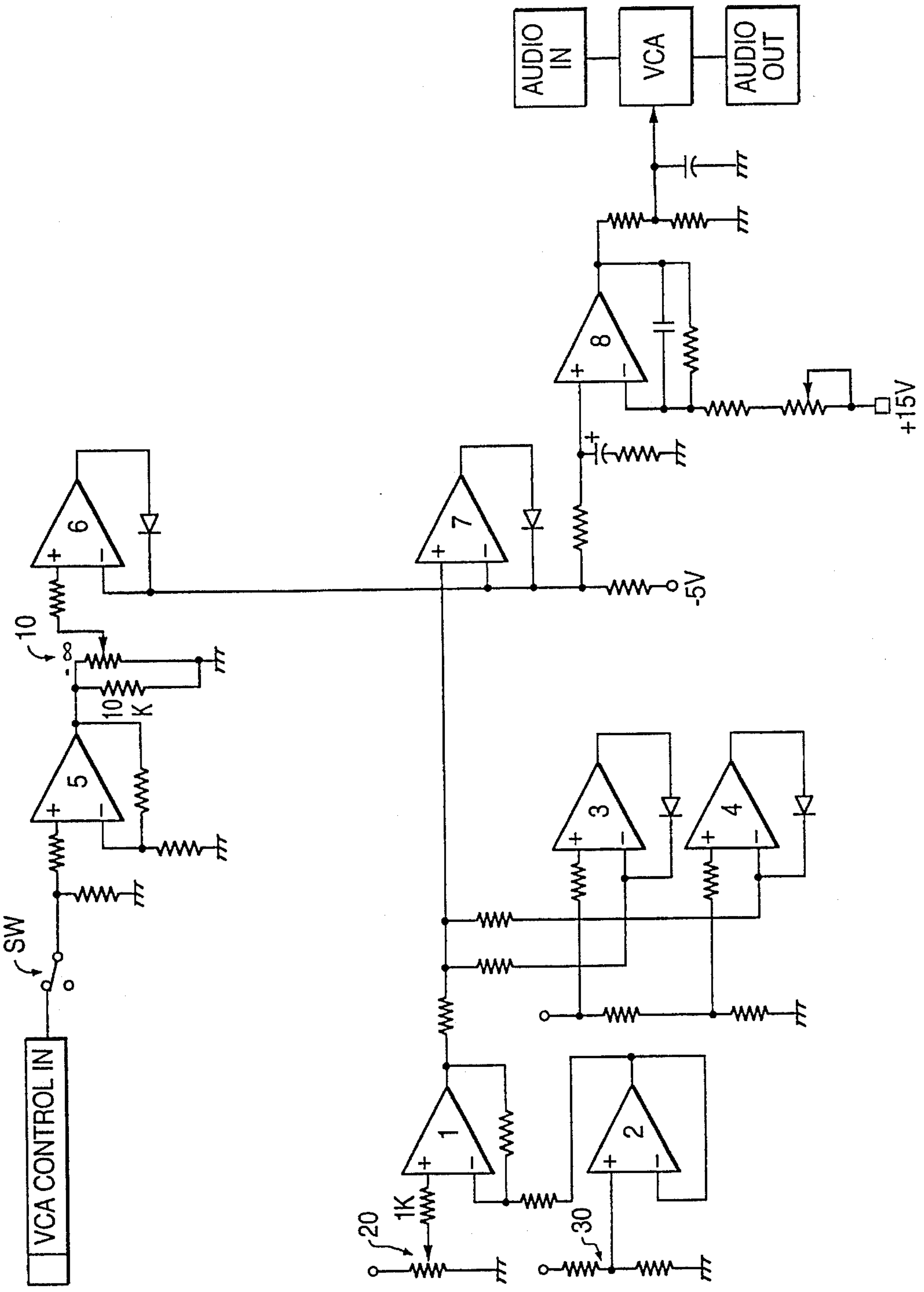
FIG. 2 PRIOR ART
FIG. 2 is a schematic illustration of a depth of fade control circuit according to the prior art.
Figure 5:
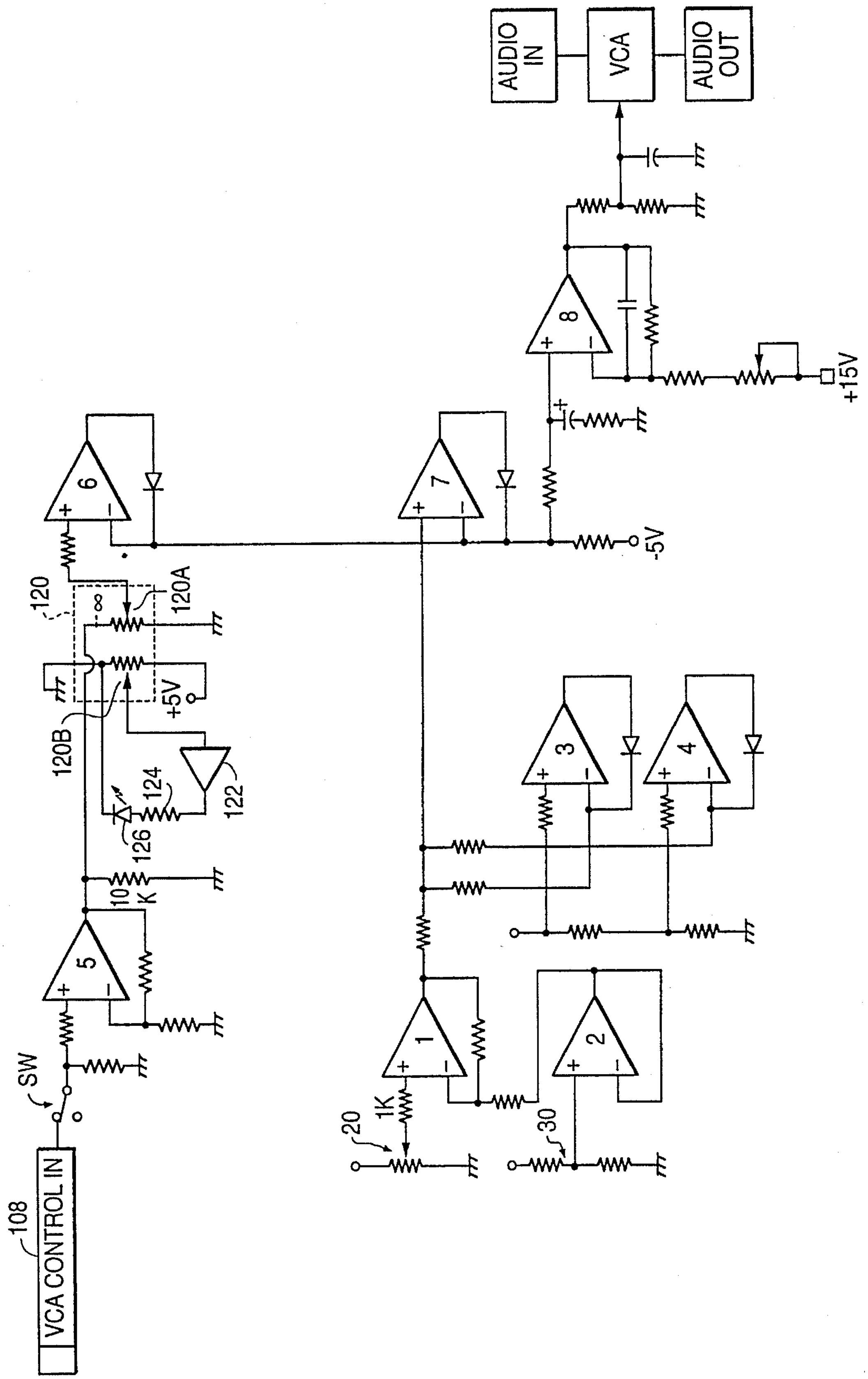
FIG. 5 is a detailed representation of an improved depth of fade indicator circuit according to a second embodiment of the invention.

An alternative embodiment of the invention is shown in FIG. 5. According to this second embodiment, the depth of fade control 10 of FIGS. 2 and 4 is replaced with a dual element fader 120. As shown, the VCA control line leads from the output of IC 5 to one element 120A of the dual element fader 120 and continues through the fader wiper of the first element 120A to IC 6. Arranged as shown, the first element 120A of the dual element fader 120 provides a means of reducing the VCA control signal to a lower level. For example, at a position marked as $-\infty$ (corresponding to the bottom position of the secondary fader shown in FIG. 3), the dual element fader 120 passes the VCA control signal without reduction. At lower positions, the VCA control signal is divided. Thus, similar to fader control 10 of FIGS. 2 and 4, the dual element fader 120 determines the absolute maximum amount by which the audio channel input to the VCA is attenuated according to the control signals input at the VCA control input terminal 108.

The second element 120B of the dual element fader 120 is coupled to circuitry which provides a visual indication of the position of the dual element fader 120. As shown, the second fader wiper is coupled to a Schmidt trigger 122 having an output coupled to the anode of a fader depth LED indicator 126 via a resistor 124. In this example, the Schmidt trigger 122 will drive the fader depth LED indicator 126 to an ON (illuminated) state whenever the dual element fader 120 is not in the position corresponding to maximum attenuation, $-\infty$ (again, corresponding to the bottom position of the secondary fader shown in FIG. 3). Thus, the depth of fade LED indicator 126 provides a visual indication based on the position of the dual element fader 120 which controls the maximum depth of fade of the audio channel.

The advantage of the second embodiment is that the signal which controls the depth of fade LED indicator 126 is independent of the VCA control signal in the VCA control line. Thus, this arrangement prevents degradation of the VCA control signal. It also provides an absolute indication of the position of the depth of fade control member regardless of the state of the control signal.

The foregoing is a detailed description of the preferred embodiment. The scope of the invention, however, is not so limited. Various alternatives will be readily apparent to one of ordinary skill in the art. For example, the configuration could be altered to illuminate the depth of fade LED indicator when the depth of fade control is in the maximum attenuation position. Alternatively, a dual colored LED could be used to indicate the position of the depth of fade control member.

Moreover, the invention is equally adaptable to mixers in which the depth of fade adjustment is dependent on the position of the main fader, as it is to mixers, such as MXP-390 series mixers, in which the main fader and depth of fade positions are independent. Accordingly, the invention is only limited by the claims appended hereto.

What is claimed is:

1. An audio mixer apparatus, comprising:

means for generating a FADE signal provided to an audio mixer, said FADE signal determining the amount of attenuation of an audio signal in said audio mixer apparatus;

first fader level control means for adjusting a maximum level of said FADE signal provided from said generating means said fader level control means being manually adjustable to a first position corresponding to a full attenuation of said FADE signal and to a second position corresponding to less than full attenuation of said FADE signal;

second fader level control means for adjusting a minimum level of said FADE signal provided from said generating means; and means, including a LED operatively coupled said first fader level control means, for providing a visual indication of whether the maximum level of said FADE signal determined by said first fader level control means is an amount corresponding to full attenuation of said FADE signal, said indicating means being electrically isolated from a signal path of said FADE signal;

wherein said first fader level control means comprises a dual element potentiometer having a first element directly coupled to said indicating means and a second element coupled to said signal path of said FADE signal, said first element and said second element being mechanically coupled together.

2. The audio mixer apparatus of claim 1, wherein said LED is illuminated when said first fader control means is in said first position.

3. The audio mixer apparatus of claim 1 wherein said means for providing a visual indication further includes a Schmidt inverter arranged to detect the adjusted maximum level of said FADE signal determined with said first fader level control means and to detect the adjusted maximum level of said FADE signal determined with said first fader level control means and to illuminate said LED when said maximum level is below a threshold voltage which is substantially equal to the level of said FADE signal which corresponds to full attenuation of said audio signal.

4. The audio mixer apparatus of claim 1 wherein said first element of said dual element potentiometer adjusts a voltage which drives said LED.

5. The audio mixer apparatus of claim 4 wherein said first element of said dual element potentiometer is directly coupled to a Schmidt trigger circuit which drives said LED based on said voltage adjusted by said first element.

6. The audio mixer apparatus of claim 1 wherein said minimum level of said FADE signal is adjusted by said second fader level control means independently of the maximum level adjusted by said first fader level control means.

7. An audio mixer apparatus, comprising:

means for generating a FADE signal provided to an audio mixer, said FADE signal determining the amount of attenuation of an audio signal in said audio mixer apparatus;

first fader level control means for adjusting a maximum level of said FADE signal provided form said generating means;

second fader level control means for adjusting a minimum level of said FADE signal provided from said generating means; and means, including a LED operatively coupled said first fader level control means, for providing a visual indication of whether the maximum level of said FADE signal determined by said first fader level control means is an amount corresponding to full attention of said FADE signal;

wherein said LED is illuminated when said first fader control means is adjusted to provide a maximum level of said FADE signal which corresponds to less than full attenuation of said audio signal;

wherein said first fader level control means comprises a dual element potentiometer; and wherein a first element of said dual element potentiometer is provided directly in the signal path of said FADE signal and a second element of said dual element potentiometer is directly coupled to said means for providing a visual indication.

8. The audio mixer apparatus of claim 7 wherein said second element of said dual element potentiometer is biased to provide a depth of fade voltage signal indicative of the position of a depth of fade control member which adjusts said dual element potentiometer.

9. The audio mixer apparatus of claim 8 wherein said LED is operatively coupled to driving means which illuminates said LED when said depth of fade voltage signal reaches a predetermined level.

10. The audio mixer apparatus of claim 9 wherein said minimum level of said FADE signal is adjusted by said second fader level control means independently of the maximum level adjusted by said first fader level control means.

* * * * *